(12) United States Patent
Kong et al.

(10) Patent No.: US 11,079,787 B2
(45) Date of Patent: Aug. 3, 2021

(54) SEMICONDUCTOR APPARATUS FOR GENERATING A REFERENCE VOLTAGE

(71) Applicant: SK hynix Inc., Icheon-si (KR)

(72) Inventors: Kyu Bong Kong, Icheon-si (KR); Jae Hyeok Yang, Icheon-si (KR); Gang Sik Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/889,382

(22) Filed: Jun. 1, 2020

(65) Prior Publication Data

US 2021/0096588 A1 Apr. 1, 2021

(30) Foreign Application Priority Data

Sep. 27, 2019 (KR) .......................... 10-2019-0119466

(51) Int. Cl.
*G05F 3/02* (2006.01)
*G05F 3/08* (2006.01)

(52) U.S. Cl.
CPC ...................................... *G05F 3/08* (2013.01)

(58) Field of Classification Search
CPC ........................................................ G05F 3/08
USPC ........................................................ 327/540
See application file for complete search history.

(56) References Cited

U.S. PATENT DOCUMENTS

| 8,582,374 | B2* | 11/2013 | Mozak | G11C 5/147 |
| | | | | 365/189.09 |
| 9,244,477 | B2 | 1/2016 | Dimitriu et al. | |
| 9,418,726 | B1* | 8/2016 | Sun | G11C 11/4099 |
| 9,536,594 | B1* | 1/2017 | Sun | G11C 7/1084 |
| 9,691,440 | B2* | 6/2017 | Sun | G11C 5/147 |
| 9,697,875 | B2* | 7/2017 | Sun | G11C 5/147 |
| 9,711,189 | B1* | 7/2017 | Wang | G11C 5/147 |
| 10,468,074 | B2* | 11/2019 | Xu | G11C 16/24 |
| 2017/0126280 | A1* | 5/2017 | Juan | H02J 50/10 |
| 2017/0154669 | A1* | 6/2017 | Sun | G11C 7/1084 |
| 2020/0195270 | A1* | 6/2020 | Hu | H03M 1/462 |
| 2020/0274741 | A1* | 8/2020 | Kang | H03F 3/45475 |

* cited by examiner

*Primary Examiner* — Ryan Jager
(74) *Attorney, Agent, or Firm* — William Park & Associates Ltd.

(57) ABSTRACT

A semiconductor apparatus includes a voltage divider, a plurality of reference voltage controllers, and a plurality of receivers. The voltage divider outputs a plurality of division voltages. Each of the plurality of reference voltage controllers is configured to receive in common the plurality of division voltages. Each of the plurality of receivers is configured to receive data by utilizing at least one reference voltage. The plurality of reference voltage controllers are coupled to the plurality of receivers in a one-to-one manner, and each of the plurality of reference voltage controllers is configured to select at least one division voltage among the plurality of division voltages and provide the one division voltage as the at least one reference voltage to a corresponding receiver among the plurality of receivers.

15 Claims, 8 Drawing Sheets

000
SEMICONDUCTOR APPARATUS FOR GENERATING A REFERENCE VOLTAGE

CROSS-REFERENCES TO RELATED APPLICATION

The present application claims priority under 35 U.S.C. § 119(a) to Korean application number 10-2019-0119466, filed on Sep. 27, 2019, in the Korean Intellectual Property Office, which is incorporated herein by reference in its entirety.

BACKGROUND

1. Technical Field

Various embodiments generally relate to an integrated circuit technology, and more particularly, to a semiconductor apparatus for receiving a signal by utilizing a reference voltage.

2. Related Art

A semiconductor apparatus may include a plurality of receivers and may receive data through the plurality of receivers. Each of the plurality of receivers may determine a logic level of the received data using a reference voltage. Each of the plurality of receivers may generate an output signal having a logic high level when the received data has a higher voltage level than the reference voltage. Each of the plurality of receivers may generate an output signal having a logic low level when the received data has a lower voltage level than the reference voltage. Each of the plurality of receivers may utilize two reference voltages for extension of a margin of the data determination. Each of the plurality of receivers may generate an output signal having a logic high level when the received data has a higher voltage level than a reference voltage having a relatively high voltage level. Each of the plurality of receivers may generate an output signal having a logic low level when the received data has a lower voltage level than a reference voltage having a relatively low voltage level.

A semiconductor apparatus may include a reference voltage generation circuit for generation of one or more reference voltages. The reference voltage generation circuit may include a voltage divider and a reference voltage controller. The voltage divider may divide a power supply voltage into a plurality of division voltages by utilizing a plurality of resistors. The reference voltage controller may select one or two among the plurality of division voltages according to a characteristic of a channel transferring data and may output the selected division voltages as the reference voltages.

The semiconductor apparatus may receive a plurality of data signals through a plurality of receivers respectively coupled to a plurality of channels. Each of the plurality of receivers utilize a reference voltage having an appropriate voltage level according to characteristics of the data signals and the channels transferring the data signals thereby determining the data signals. According to prior art, each receiver has the reference voltage controller and the voltage divider in order to consider individual characteristics of the data signals and the channels. However, for a case in which each receiver has the reference voltage controller and the voltage divider, an operation performance of a semiconductor apparatus cannot be guaranteed due to increase of a space occupied for circuitry of the semiconductor apparatus and increase of power consumption of the semiconductor apparatus.

SUMMARY

In accordance with an embodiment of the present disclosure, a semiconductor apparatus may include a voltage divider, a reference voltage control circuit, and a reception circuit. The voltage divider may be configured to divide a power supply voltage into a plurality of division voltages. The reference voltage control circuit may include a plurality of reference voltage controllers. Each of the plurality of reference voltage controllers may be configured to receive in common the plurality of division voltages. The reception circuit may include a plurality of receivers. Each of the plurality of receivers may be configured to receive data by utilizing at least one reference voltage. The plurality of reference voltage controllers are coupled to the plurality of receivers in a one-to-one manner. Each of the plurality of reference voltage controllers may be configured to select at least one division voltage among the plurality of division voltages as at least one reference voltage, and provide the at least one reference voltage to a corresponding receiver among the plurality of receivers.

In accordance with an embodiment of the present disclosure, a semiconductor apparatus may include a first receiver, a second receiver, a voltage divider, a first reference voltage controller, and a second reference voltage controller. The first receiver may be configured to receive first data by utilizing a first reference voltage and a second reference voltage. The second receiver may be configured to receive second data by utilizing a third reference voltage and a fourth reference voltage. The voltage divider may be configured to divide a power supply voltage into a plurality of division voltages. The first reference voltage controller may be configured to select two division voltages among the plurality of division voltages and provide the selected voltages, as the first reference voltage and the second reference voltage, to the first receiver; and a second reference voltage controller may be configured to select two division voltages among the plurality of division voltages and provide the selected voltages, as the third reference voltage and the fourth reference voltage, to the second receiver.

In accordance with an embodiment of the present disclosure, a semiconductor apparatus may include a voltage division circuit, a reference voltage control circuit, and a reception circuit. The voltage division circuit may include a plurality of voltage divides located in a first region. Each of the plurality of voltage dividers may be configured to divide a power supply voltage into a plurality of division voltages. The reference voltage control circuit may include a plurality of reference voltage controllers located in a second region. The plurality of reference voltage controllers may be coupled to the plurality of voltage dividers in a one-to-one manner. The reception circuit may include a plurality of receivers located in a third region. Each of the plurality of receivers may be configured to receive data by utilizing at least one reference voltage. The plurality of reference voltage controllers are coupled to the plurality of receivers in a one-to-one manner. Each of the plurality of reference voltage controllers may be configured to select at least one division voltage among the plurality of division voltages, which are received from a corresponding voltage divider among the plurality of voltage dividers. Each of the plurality of reference voltage controllers may be configured to provide the at least one division voltage as at least one reference voltage to a corresponding receiver among the plurality of receivers.

DETAILED DESCRIPTION

Figure 1:
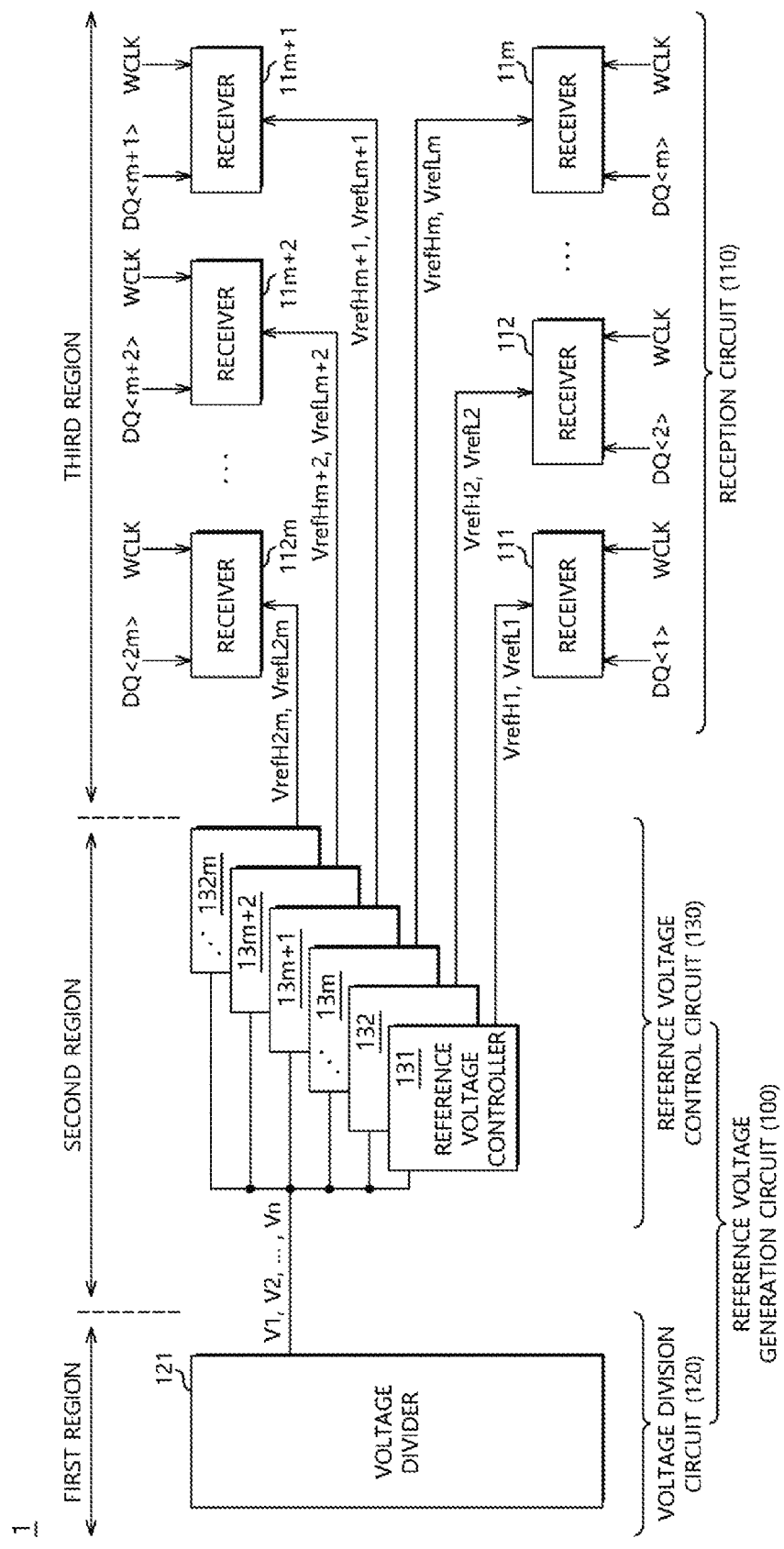
FIG. 1 is a diagram illustrating a configuration of a semiconductor apparatus in accordance with an embodiment.

FIG. 1 is a diagram illustrating a configuration of a semiconductor apparatus 1 in accordance with an embodiment of the present disclosure. Referring to FIG. 1, the semiconductor apparatus 1 may include a reference voltage generation circuit 100 and a reception circuit 110. The reference voltage generation circuit 100 may receive a power supply voltage VDD and may generate at least one reference voltage. The reception circuit 110 may receive a plurality of pieces of data DQ<1>, DQ<2>, ..., DQ<m>, DQ<m+1>, DQ<m+2>, ..., DQ<2m> ('m' is an integer equal to or greater than 3). The reception circuit 110 may utilize the reference voltage, which is generated by the reference voltage generation circuit 100, in order to receive the plurality of pieces of data DQ<1>, DQ<2>, ..., DQ<m>, DQ<m+1>, DQ<m+2>, ..., DQ<2m>. The reception circuit 110 may include a plurality of receivers 111, 112, ..., 11m, 11m+1, 11m+2, ..., 112m configured to receive the plurality of pieces of data DQ<1>, DQ<2>, ..., DQ<m>, DQ<m+1>, DQ<m+2>, ..., DQ<2m>. Each of the plurality of receivers 111, 112, ..., 11m, 11m+1, 11m+2, ..., 112m may receive one data signal. The plurality of receivers 111, 112, ..., 11m, 11m+1, 11m+2, ..., 112m may be coupled respectively to a plurality of channels (not illustrated) configured to transfer the plurality of pieces of data DQ<1>, DQ<2>, ..., DQ<m>, DQ<m+1>, DQ<m+2>, ..., DQ<2m>. The reference voltage generation circuit 100 may generate a plurality of reference voltages to be utilized by the plurality of receivers 111, 112, ..., 11m, 11m+1, 11m+2, ..., 112m. The reference voltage generation circuit 100 may provide each receiver with at least one reference voltage.

The reference voltage generation circuit 100 may include a voltage division circuit 120 and a reference voltage control circuit 130. The voltage division circuit 120 may be located in a first region. The voltage division circuit 120 may generate a plurality of division voltages V1, V2, ..., Vn ('n' is an integer equal to or greater than 3) based on the power supply voltage VDD. The voltage division circuit 120 may provide the reference voltage control circuit 130 with the plurality of division voltages V1, V2, ..., Vn. The voltage division circuit 120 may include a voltage divider 121 configured to generate the plurality of division voltages V1, V2, ..., Vn by dividing the power supply voltage VDD. The voltage division circuit 120 may include only one voltage divider 121.

The reference voltage control circuit 130 may be located in a second region. The second region may be adjacent to the first region. The reference voltage control circuit 130 may include a plurality of reference voltage controllers 131, 132, ..., 13m, 13m+1, 13m+2, ..., 132m. A number of the plurality of reference voltage controllers 131, 132, ..., 13m, 13m+1, 13m+2, ..., 132m included in the reference voltage control circuit 130 may be the same as a number of the plurality of receivers 111, 112, ..., 11m, 11m+1, 11m+2, ..., 112m included in the reception circuit 110. The plurality of reference voltage controllers 131, 132, ..., 13m, 13m+1, 13m+2, ..., 132m may correspond the plurality of receivers 111, 112, ..., 11m, 11m+1, 11m+2, ..., 112m in a one-to-one manner. Each of the plurality of reference voltage controllers 131, 132, ..., 13m, 13m+1, 13m+2, ..., 132m may receive the plurality of division voltages V1, V2, ..., Vn generated by the voltage division circuit 120. Each of the plurality of reference voltage controllers 131, 132, ..., 13m, 13m+1, 13m+2, ..., 132m may select two division voltages among the plurality of division voltages V1, V2, ..., Vn. Each of the plurality of reference voltage controllers 131, 132, ..., 13m, 13m+1, 13m+2, ..., 132m may provide the reference voltage control circuit 130 with the selected two division voltages as two reference voltages. Therefore, voltage levels of respective two reference voltages, which are provided from the plurality of reference voltage controllers 131, 132, ..., 13m, 13m+1, 13m+2, ..., 132m, may be the same as or different from one another. The reference voltage controller 131 may provide the receiver 111 with a first reference voltage VrefH1 and a second reference voltage VrefL1. The reference voltage controller 132 may provide the receiver 112 with a first reference voltage VrefH2 and a second reference voltage VrefL2. The reference voltage controller 13m may provide the receiver 11m with a first reference voltage VrefHm and a second reference voltage VrefLm. The reference voltage controller 13m+1 may provide the receiver 11m+1 with a first reference voltage VrefHm+1 and a second reference voltage VrefLm+1. The reference voltage controller 13m+2 may provide the receiver 11m+2 with a first reference voltage VrefHm+2 and a second reference voltage VrefLm+2. The reference voltage controller 132m may provide the receiver 112m with a first reference voltage VrefH2m and a second reference voltage VrefL2m.

In an embodiment, the second region may be located in a mode register (not illustrated). The mode register may be setting circuitry configured to store information related to an operation of the semiconductor apparatus 1. The mode register may store information related to the first reference voltages VrefH1, VrefH2, ..., VrefHm, VrefHm+1, VrefHm+2, ..., VrefH2m and the second reference voltages VrefL1, VrefL2, ..., VrefLm, VrefLm+1, VrefLm+2, ..., VrefL2m, which are to be utilized to determine the plurality of pieces of data DQ<1>, DQ<2>, ..., DQ<m>, DQ<m+1>, DQ<m+2>, ..., DQ<2m>, respectively. Based on the information stored in the mode register, the plurality of reference voltage controllers 131, 132, ..., 13m, 13m+1, 13m+2, . . . , 132m may respectively select, as the first reference voltages VrefH1, VrefH2, . . . , VrefHm, VrefHm+1, VrefHm+2, . . . , VrefH2m and the second reference voltages VrefL1, VrefL2, . . . , VrefLm, VrefLm+1, VrefLm+2, . . . , VrefL2m, pairs from the plurality of division voltages V1, V2, . . . , Vn, which are generated by the voltage divider 121.

The reception circuit 110 may be located in a third region. The third region may be adjacent to the first region and the second region. For example, the second region may be between the first region and the third region. The plurality of receivers 111, 112, . . . , 11m, 11m+1, 11m+2, . . . , 112m within the reception circuit 110 may receive the plurality of pieces of data DQ<1>, DQ<2>, . . . , DQ<m>, DQ<m+1>, DQ<m+2>, . . . , DQ<2m> respectively corresponding thereto. Each of the plurality of receivers 111, 112, . . . , 11m, 11m+1, 11m+2, . . . , 112m within the reception circuit 110 may receive a clock signal WCLK. The plurality of receivers 111, 112, . . . , 11m, 11m+1, 11m+2, . . . , 112m may receive the first reference voltages VrefH1, VrefH2, . . . , VrefHm, VrefHm+1, VrefHm+2, . . . , VrefH2m and the second reference voltages VrefL1, VrefL2, . . . , VrefLm, VrefLm+1, VrefLm+2, . . . , VrefL2m from the plurality of reference voltage controllers 131, 132, . . . , 13m, 13m+1, 13m+2, . . . , 132m, respectively. In synchronization with the clock signal WCLK, the plurality of receivers 111, 112, . . . , 11m, 11m+1, 11m+2, . . . , 112m may receive and determine the plurality of pieces of data DQ<1>, DQ<2>, . . . , DQ<m>, DQ<m+1>, DQ<m+2>, . . . , DQ<2m> based on the first reference voltages VrefH1, VrefH2, . . . , VrefHm, VrefHm+1, VrefHm+2, . . . , VrefH2m and the second reference voltages VrefL1, VrefL2, . . . , VrefLm, VrefLm+1, VrefLm+2, . . . , VrefL2m, respectively. The first reference voltages VrefH1, VrefH2, . . . , VrefHm, VrefHm+1, VrefHm+2, . . . , VrefH2m may have different voltage levels from the second reference voltages VrefL1, VrefL2, . . . , VrefLm, VrefLm+1, VrefLm+2, . . . , VrefL2m, respectively. For example, the first reference voltages VrefH1, VrefH2, . . . , VrefHm, VrefHm+1, VrefHm+2, . . . , VrefH2m may have higher voltage levels than the second reference voltages VrefL1, VrefL2, . . . , VrefLm, VrefLm+1, VrefLm+2, . . . , VrefL2m, respectively.

According to prior art, a semiconductor apparatus has a voltage divider and a reference voltage controller for each receiver. In accordance with an embodiment of the present disclosure, the plurality of reference voltage controllers 131, 132, . . . , 13m, 13m+1, 13m+2, . . . , 132m coupled respectively to the plurality of receivers 111, 112, . . . , 11m, 11m+1, 11m+2, . . . , 112m may be respectively detached from the plurality of receivers 111, 112, . . . , 11m, 11m+1, 11m+2, . . . , 112m. The detached reference voltage controllers 131, 132, . . . , 13m, 13m+1, 13m+2, . . . , 132m may be disposed together in the second region. Therefore, the size of the third region, in which the plurality of receivers 111, 112, . . . , 11m, 11m+1, 11m+2, . . . , 112m are disposed together, may be smaller than a size of a region occupied for a plurality of receivers included in a semiconductor apparatus of the prior art. Also, a length of a clock transmission line for transferring the clock signal WCLK to each of the plurality of receivers 111, 112, . . . , 11m, 11m+1, 11m+2, . . . , 112m may be reduced. The plurality of reference voltage controllers 131, 132, . . . , 13m, 13m+1, 13m+2, . . . , 132m configured to select particular division voltages from the plurality of division voltages V1, V2, . . . , Vn and output as the reference voltages the selected division voltages may be margin points, at which timing margins of generating reference voltages are determined. In accordance with an embodiment of the present disclosure, the configuration of the reference voltage generation circuit 100 may be simplified and the plurality of reference voltage controllers 131, 132, . . . , 13m, 13m+1, 13m+2, . . . , 132m configured to control the generation of the reference voltages may be controlled together in the second region. Therefore, the timing margins of the reference voltage generation circuit 100 may be improved and management of the margin points may be simplified. Also, jitter or skew likely to occur in the clock signal WCLK may be reduced by reducing the length of the clock transmission line. Further, because each of the plurality of reference voltage controllers 131, 132, . . . , 13m, 13m+1, 13m+2, . . . , 132m may receive the plurality of division voltages V1, V2, . . . , Vn generated by one voltage divider 121 within the semiconductor apparatus 1, removed may be a possibility of a mismatch of a resistance value within each of a plurality of voltage dividers and drastically reduced may be a static current consumed by a voltage divider.

Figure 2:
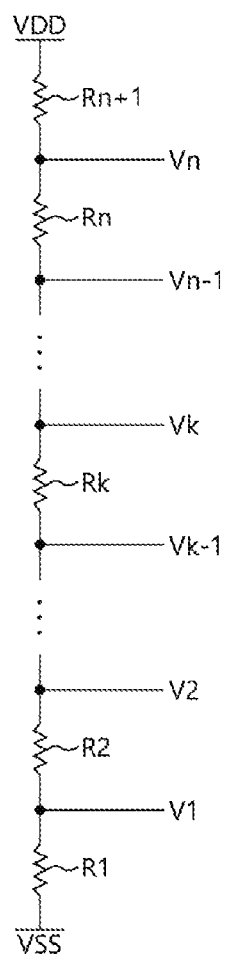
FIG. 2 is a diagram illustrating a configuration of a voltage divider illustrated in FIG. 1.

FIG. 2 is a diagram illustrating a configuration of the voltage divider 121 illustrated in FIG. 1. Referring to FIG. 2, the voltage divider 121 may include a plurality of division resistors R1, R2, . . . , Rk, . . . , Rn, Rn+1. A number of the plurality of division resistors R1, R2, . . . , Rk, . . . , Rn, Rn+1 may be 'n+1' and 'k' may be an integer equal to or greater than 4. As the number of the plurality of division resistors R1, R2, . . . , Rk, . . . , Rn, Rn+1 becomes greater, difference between voltage levels of the plurality of division voltages V1, V2, . . . , Vn, which are generated by the voltage divider 121, may become smaller. Therefore, it is possible to generate a reference voltage close to a target level. The plurality of division resistors R1, R2, . . . , Rk, . . . , Rn, Rn+1 may be coupled to each other in series between a node, to which a power supply voltage VDD is provided, and a node, to which a ground voltage VSS is provided. Resistance values of the plurality of division resistors R1, R2, . . . , Rk, . . . , Rn, Rn+1 may be the same as one another. Therefore, an end-to-end voltage level of each of the plurality of division resistors R1, R2, . . . , Rk, . . . , Rn, Rn+1 may be the voltage level of the power supply voltage VDD divided by 'n+1' and the end-to-end voltage levels of the plurality of division resistors R1, R2, . . . , Rk, . . . , Rn, Rn+1 may be the same as one another. When 'k' an integer between 1 and 'n', the voltage levels Vk and Vk−1 at both ends of the division resistor Rk may be 'VDD*k/(n+1)' and VDD*(k−1)/(n+1)', respectively. The voltage divider 121 may output the voltage levels at nodes between the plurality of division resistors R1, R2, . . . , Rk, . . . , Rn, Rn+1 as the plurality of division voltages V1, V2, . . . , Vn, respectively. The voltage division circuit 120 may generate the plurality of division voltages V1, V2, . . . , Vn through the voltage divider 121. The voltage division circuit 120 may provide the plurality of division voltages V1, V2, . . . , Vn to each of the plurality of reference voltage controllers 131, 132, . . . , 13m, 13m+1, 13m+2, . . . , 132m.

Figure 3:
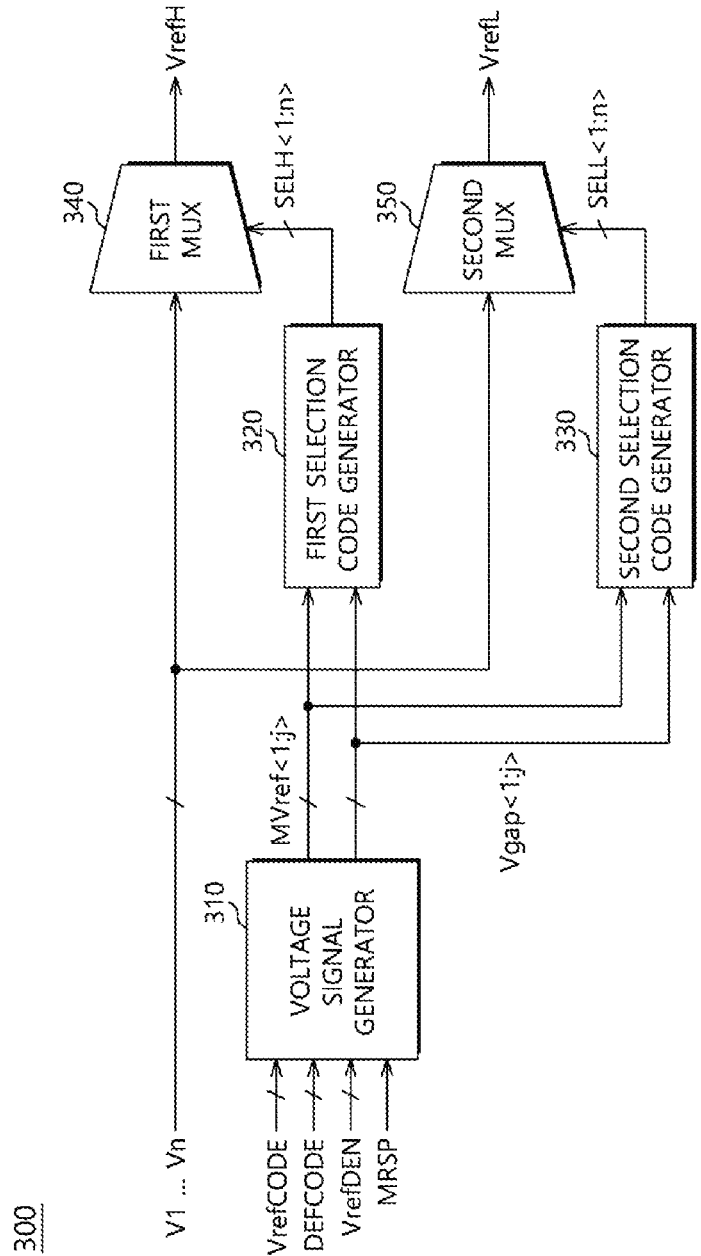
FIG. 3 is a diagram illustrating a configuration of a reference voltage controller in accordance with an embodiment.

FIG. 3 is a diagram illustrating a configuration of the reference voltage controller 300 in accordance with an embodiment of the present disclosure. The reference voltage controller 300 may be applied as each of the plurality of reference voltage controllers 131, 132, . . . , 13m, 13m+1, 13m+2, . . . , 132m illustrated in FIG. 1. Referring to FIG. 3, the reference voltage controller 300 may include a voltage signal generator 310, a first selection code generator 320, a second selection code generator 330, a first multiplexer (MUX) 340, and a second MUX 350. The voltage signal generator 310 may receive a reference voltage code VrefCODE, a combiner code DEFCODE, a pin determination signal VrefDEN, and a setting signal MRSP. The voltage signal generator 310 may output an intermediate voltage code MVref<1:j> and a voltage difference code Vgap<1:j>. 'j' may be an integer equal to or greater than 1. The reference voltage code VrefCODE, the combiner code DEFCODE and the pin determination signal VrefDEN may include information about a channel for transferring data to be input to a receiver corresponding to the reference voltage controller 300. The reference voltage code VrefCODE, the combiner code DEFCODE and the pin determination signal VrefDEN may include information about voltage levels of a first reference voltage VrefH and a second reference voltage VrefL, which are appropriate for a receiver corresponding to the reference voltage controller 300 to determine data. For example, the reference voltage code VrefCODE may include information about an average value of each one of the pairs of reference voltages VrefH1, VrefH2, VrefHm, VrefHm+1, VrefHm+2, . . . , VrefH2m, VrefL1, VrefL2, . . . , VrefLm, VrefLm+1, VrefLm+2, . . . , VrefL2m, respectively utilized by the plurality of receivers 111, 112, . . . , 11m, 11m+1, 11m+2, . . . , 112m illustrated in FIG. 1. For example, the combiner code DEFCODE may include information about difference between each one of the pairs of reference voltages VrefH1, VrefH2, . . . , VrefHm, VrefHm+1, VrefHm+2, . . . , VrefH2m, VrefL1, VrefL2, . . . , VrefLm, VrefLm+1, VrefLm+2, . . . , VrefL2m, respectively utilized by the plurality of receivers 111, 112, . . . , 11m, 11m+1, 11m+2, . . . , 112m illustrated in FIG. 1. The setting signal MRSP may instruct to set the voltage levels of a pair of reference voltages VrefH and VrefL. Each of the reference voltage code VrefCODE and the combiner code DEFCODE may have various values. The reference voltage code VrefCODE, the combiner code DEFCODE, and the setting signal MRSP may be provided to each of the plurality of reference voltage controllers 131, 132, . . . , 13m, 13m+1, 13m+2, . . . , 132m illustrated in FIG. 1. The pin determination signal VrefDEN may include individual pieces of information about channels respectively corresponding to the plurality of reference voltage controllers 131, 132, . . . , 13m, 13m+1, 13m+2, . . . , 132m and thus the pin determination signal VrefDEN to be provided to each of the reference voltage controllers 131, 132, . . . , 13m, 13m+1, 13m+2, . . . , 132m may be different from one another. The intermediate voltage code MVref<1:j> may include information about an average value between a first reference voltage VrefH and a second reference voltage VrefL for a corresponding channel. The voltage difference code Vgap<1:j> may include information about a half of difference between voltage levels of the first reference voltage VrefH and the second reference voltage VrefL.

The first selection code generator 320 may receive the intermediate voltage code MVref<1:j> and the voltage difference code Vgap<1:j>. The first selection code generator 320 may generate a first selection code SELH<1:n>. The first selection code generator 320 may provide the first selection code SELH<1:n> to the first MUX 340. The first selection code SELH<1:n> may include information about a voltage level of a first reference voltage VrefH required for a receiver corresponding to the reference voltage controller 300.

The second selection code generator 330 may receive the intermediate voltage code MVref<1:j> and the voltage difference code Vgap<1:j>. The second selection code generator 330 may generate a second selection code SELL<1:n>. The second selection code generator 330 may provide the second selection code SELL<1:n> to the second MUX 350. The second selection code SELL<1:n> may include information about a voltage level of a second reference voltage VrefL required for the receiver corresponding to the reference voltage controller 300.

The first MUX 340 may output the first reference voltage VrefH. The first MUX 340 may receive the plurality of division voltages V1, V2, . . . , Vn. The first MUX 340 may output, as the first reference voltage VrefH, one division voltage among the plurality of division voltages V1, V2, . . . , Vn based on the first selection code SELH<1:n>. The first reference voltage VrefH may be provided to a corresponding receiver.

The second MUX 350 may output the second reference voltage VrefL. The second MUX 350 may receive the plurality of division voltages V1, V2, . . . , Vn. The second MUX 350 may output, as the second reference voltage VrefL, one division voltage among the plurality of division voltages V1, V2, . . . , Vn based on the second selection code SELL<1:n>. The second reference voltage VrefL may be provided to a corresponding receiver.

Figure 4:
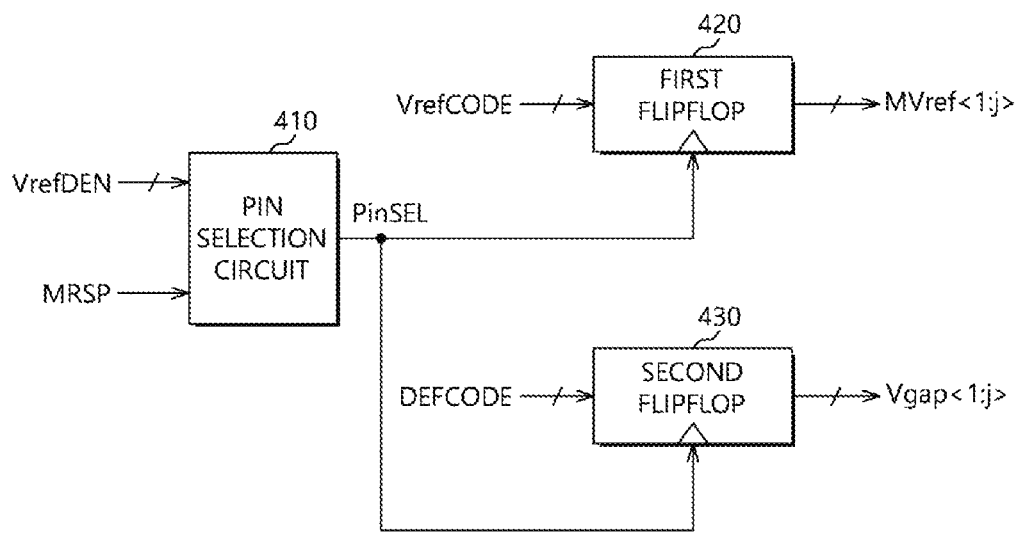
FIG. 4 is a diagram illustrating a configuration of a voltage signal generator illustrated in FIG. 3.

FIG. 4 is a diagram illustrating a configuration of the voltage signal generator 310 illustrated in FIG. 3. Referring to FIG. 4, the voltage signal generator 310 may include a pin selection circuit 410, a first flip-flop 420, and a second flip-flop 430.

The pin selection circuit 410 may receive the pin determination signal VrefDEN and the setting signal MRSP. The pin selection circuit 410 may output a pin selection signal PinSEL. The pin selection signal PinSEL may include information about the plurality of receivers 111, 112, . . . , 11m, 11m+1, 11m+2, . . . , 112m respectively corresponding to the plurality of reference voltage controllers 131, 132, . . . , 13m, 13m+1, 13m+2, . . . , 132m illustrated in FIG. 1.

The first flip-flop 420 may receive the pin selection signal PinSEL and the reference voltage code VrefCODE. The first flip-flop 420 may output the intermediate voltage code MVref<1:j>. The first flip-flop 420 may output, as the intermediate voltage code MVref<1:j>, the reference voltage code VrefCODE based on the pin selection signal PinSEL. The second flip-flop 430 may receive the pin selection signal PinSEL and the combiner code DEFCODE. The second flip-flop 430 may output the voltage difference code Vgap<1:j>. The second flip-flop 430 may output, as the voltage difference code Vgap<1:j>, the combiner code DEFCODE based on the pin selection signal PinSEL.

Figure 5:
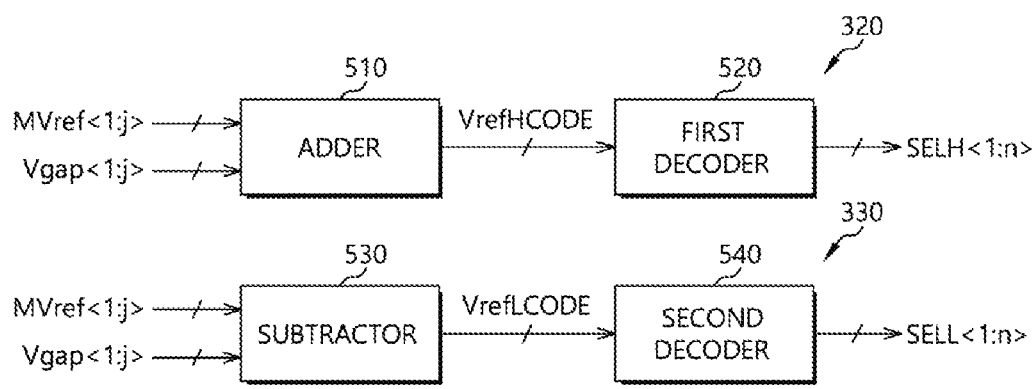
FIG. 5 is a diagram illustrating configurations of a first selection code generator and a second selection code generator illustrated in FIG. 3.

FIG. 5 is a diagram illustrating configurations of the first selection code generator 320 and the second selection code generator 330 illustrated in FIG. 3. Referring to FIG. 5, the first selection code generator 320 may include an adder 510 and a first decoder 520, and the second selection code generator 330 may include a subtractor 530 and a second decoder 540.

The adder 510 may generate a first reference voltage code VrefHCODE, which includes information about the voltage level of the first reference voltage VrefH, by adding the voltage difference code Vgap<1:j> to the intermediate voltage code MVref<1:j>.

The first decoder 520 may output, by decoding the first reference voltage code VrefHCODE, the first selection code SELH<1:n>, which allows the first MUX 340 to select the first reference voltage VrefH from the plurality of division voltages V1, V2, . . . , Vn. A number of bits within the first selection code SELH<1:n> may correspond to the number of plurality of division voltages V1, V2, . . . , Vn. For example, the first selection code SELH<1:n> may include 'n' number of bits.

The subtractor 530 may output a second reference voltage code VrefLCODE, which includes information about the voltage level of the second reference voltage VrefL, by subtracting the voltage difference code Vgap<1:j> from the intermediate voltage code MVref<1:j>.

The second decoder 540 may output, by decoding the second reference voltage code VrefLCODE, the second selection code SELL<1:n>, which allows the second MUX 350 to select the second reference voltage VrefL from the plurality of division voltages V1, V2, . . . , Vn. A number of bits within the second selection code SELL<1:n> may correspond to the number of plurality of division voltages V1, V2, . . . , Vn. For example, the second selection code SELL<1:n> may include 'n' number of bits.

Figure 6:
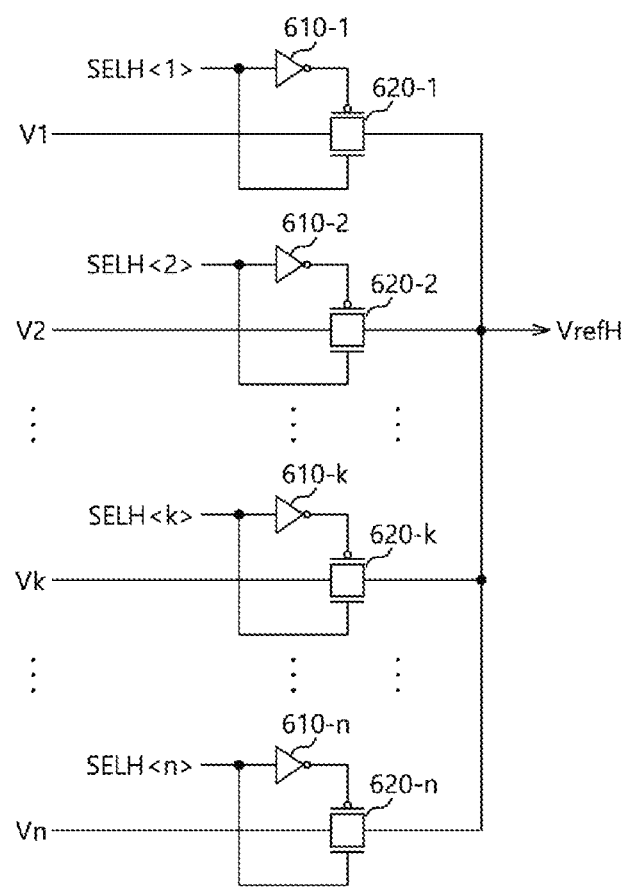
FIG. 6 is a diagram illustrating a configuration of a first multiplexer illustrated in FIG. 3.

FIG. 6 is a diagram illustrating a configuration of the first MUX 340 illustrated in FIG. 3. Referring to FIG. 6, the first MUX 340 may include a first inverter 610-1, a second inverter 610-2, a k-th inverter 610-k, an n-th inverter 610-n, a first pass gate 620-1, a second pass gate 620-2, a k-th pass gate 620-k and an n-th gate 620-n.

The first inverter 610-1 may receive the first bit SELH<1> of the first selection code SELH<1:n>. The first inverter 610-1 may invert the first bit SELH<1> of the first selection code SELH<1:n>. The first pass gate 620-1 may receive the first bit SELH<1> of the first selection code SELH<1:n>, the output of the first inverter 610-1 and the division voltage V1. The first pass gate 620-1 may output the division voltage V1 as the first reference voltage VrefH according to the first bit SELH<1> of the first selection code SELH<1:n> and the output of the first inverter 610-1. The second inverter 610-2 may receive the second bit SELH<2> of the first selection code SELH<1:n>. The second inverter 610-2 may invert the second bit SELH<2> of the first selection code SELH<1:n>. The second pass gate 620-2 may receive the second bit SELH<2> of the first selection code SELH<1:n>, the output of the second inverter 610-2 and the division voltage V2. The second pass gate 620-2 may output the division voltage V2 as the first reference voltage VrefH according to the second bit SELH<2> of the first selection code SELH<1:n> and the output of the second inverter 610-2. The k-th inverter 610-k may receive the k-th bit SELH<k> of the first selection code SELH<1:n>. The k-th inverter 610-k may invert the k-th bit SELH<k> of the first selection code SELH<1:n>. The k-th pass gate 620-k may receive the k-th bit SELH<k> of the first selection code SELH<1:n>, the output of the k-th inverter 610-k, and the division voltage Vk. The k-th pass gate 620-k may output the division voltage Vk as the first reference voltage VrefH according to the k-th bit SELH<k> of the first selection code SELH<1:n> and the output of the k-th inverter 610-k. The n-th inverter 610-n may receive the n-th bit SELH<n> of the first selection code SELH<1:n>. The n-th inverter 610-n may invert the n-th bit SELH<n> of the first selection code SELH<1:n>. The n-th pass gate 620-n may receive the n-th bit SELH<n> of the first selection code SELH<1:n>, the output of the n-th inverter 610-n, and the division voltage Vn. The n-th pass gate 620-n may output the division voltage Vn as the first reference voltage VrefH according to the n-th bit SELH<n> of the first selection code SELH<1:n> and the output of the n-th inverter 610-n.

The second MUX 350 illustrated in FIG. 3 may have the same configuration as the first MUX 340 except for the input signal and the output signal. Except that the second MUX 350 may receive the first bit SELL<1> to the n-th bit SELL<n> of the second selection code SELL<1:n> instead of the first bit SELH<1> to the n-th bit SELH<n> of the first selection code SELH<1:n> and the second MUX 350 may output the second reference voltage VrefL instead of the first reference voltage VrefH, the second MUX 350 may have the same configuration and may perform the same operation as the first MUX 340.

Figure 7:
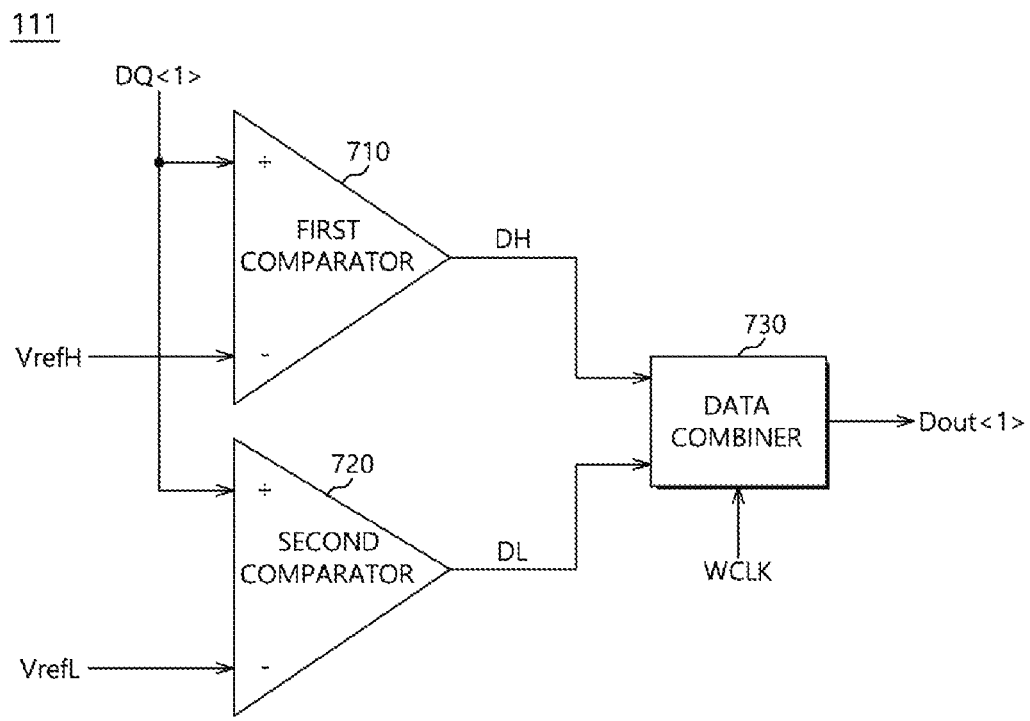
FIG. 7 is a diagram illustrating a configuration of a receiver illustrated in FIG. 1.

FIG. 7 is a diagram illustrating a configuration of the receiver 111 illustrated in FIG. 1. Referring to FIG. 7, the receiver 111 may include a first comparator 710, a second comparator 720, and a data combiner 730. The first comparator 710 may receive the first reference voltage VrefH1 and the data DQ<1>. The first comparator 710 may output a first data determination signal DH. The first comparator 710 may compare the voltage levels of the first reference voltage VrefH1 and the data DQ<1>. The first comparator 710 may output the first data determination signal DH having a logic high level when the data DQ<1> has a higher voltage level than the first reference voltage VrefH1. The first comparator 710 may output the first data determination signal DH having a logic low level when the data DQ<1> has a lower voltage level than the first reference voltage VrefH1.

The second comparator 720 may receive the second reference voltage VrefL1 and the data DQ<1>. The second comparator 720 may output a second data determination signal DL. The second comparator 720 may compare the voltage levels of the second reference voltage VrefL1 and the data DQ<1>. The second comparator 720 may output the second data determination signal DL having a logic high level when the data DQ<1> has a higher voltage level than the second reference voltage VrefL1. The second comparator 720 may output the second data determination signal DL having a logic low level when the data DQ<1> has a lower voltage level than the second reference voltage VrefL1.

The data combiner 730 may output, in synchronization with the clock signal WCLK, output data Dout<1> based on the logic levels of the first data determination signal DH and the second data determination signal DL. The plurality of receivers 112, . . . , 11m, 11m+1, 11m+2, . . . , 112m may have the same configuration and may perform the same operation as the receiver 111 except for different input signal and output signal.

Figure 8:
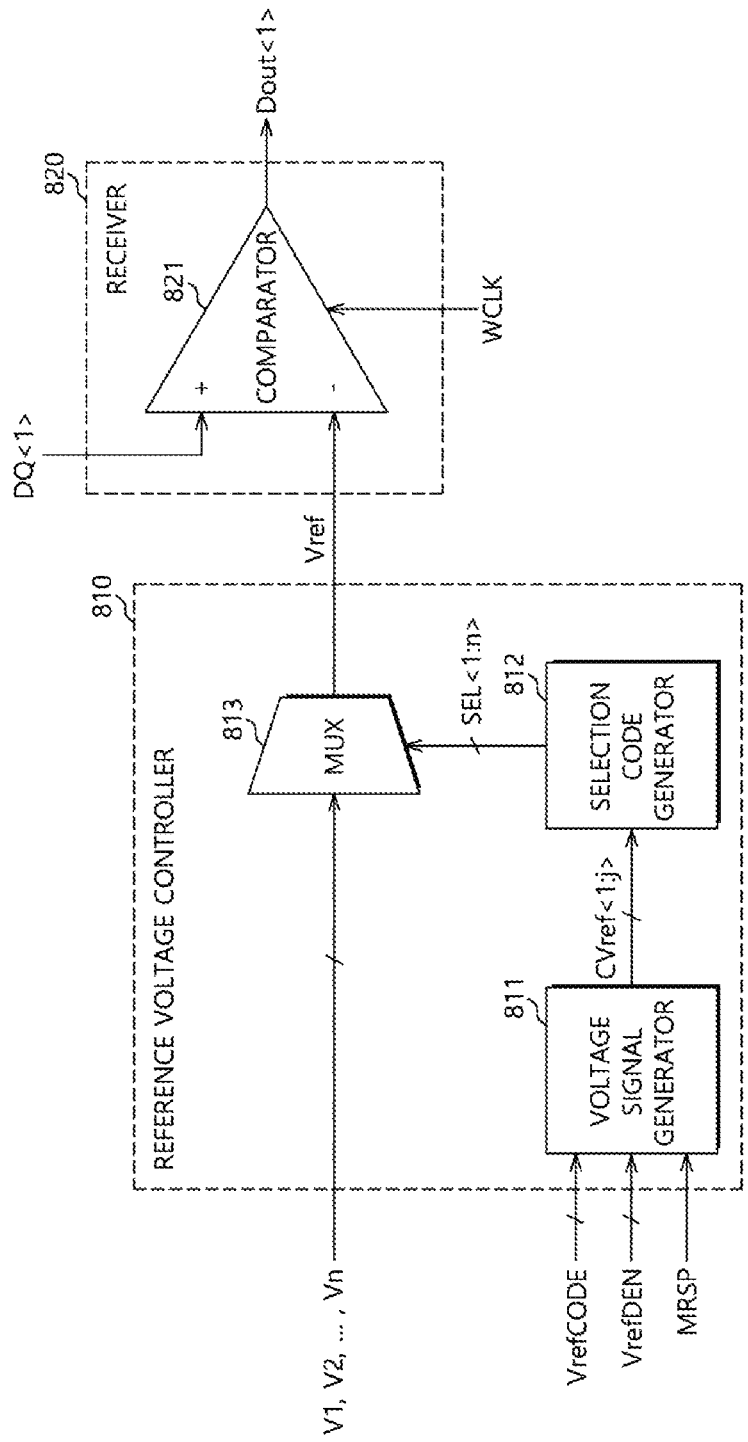
FIG. 8 is a diagram illustrating configurations of and coupling relationship between a reference voltage controller and a receiver in accordance with an embodiment.

FIG. 8 is a diagram illustrating configurations of and coupling relationship between a reference voltage controller 810 and a receiver 820 in accordance with an embodiment of the present disclosure. The reference voltage controller 810 may replace the reference voltage controller 131 illustrated in FIG. 1 and the receiver 820 may replace the receiver 111 illustrated in FIG. 1. Referring to FIG. 1, the reference voltage controller 131 may generate the two reference voltages VrefH1 and VrefL1 and the receiver 111 may receive the data DQ<1> by utilizing the two reference voltages VrefH1 and VrefL1. Referring to FIG. 8, the reference voltage controller 810 may generate one reference voltage Vref and the receiver 820 may receive the data DQ<1> by utilizing the single reference voltage Vref.

The reference voltage controller 810 may include a voltage signal generator 811, a selection code generator 812, and a MUX 813. The voltage signal generator 811 may receive a reference voltage code VrefCODE, a pin determination signal VrefDEN, and a setting signal MRSP. The voltage signal generator 811 may output a voltage code CVref<1:j>. The reference voltage controller 810 may generate one reference voltage and thus the voltage signal generator 811 may not need to receive the combiner code DEFCODE illustrated in FIG. 3. The selection code generator 812 may receive the voltage code CVref<1:j>. The selection code generator 812 may output a selection code SEL<1:n>. The MUX 813 may select, based on the selection code SEL<1: n>, one division voltage among the plurality of division voltages V1, V2, . . . , Vn output from the voltage divider 121. The MUX 813 may output the selected division voltage as the reference voltage Vref.

The receiver 820 may include a comparator 821. The comparator 821 may receive the reference voltage Vref and the data DQ<1>. The comparator 821 may output the output data Dout<1>. The comparator 821 may output the output data Dout<1> having a logic high level when the data DQ<1> has a higher voltage level than the reference voltage Vref. The comparator 821 may output the output data Dout<1> having a logic low level when the data DQ<1> has a lower voltage level than the reference voltage Vref.

Figure 9:
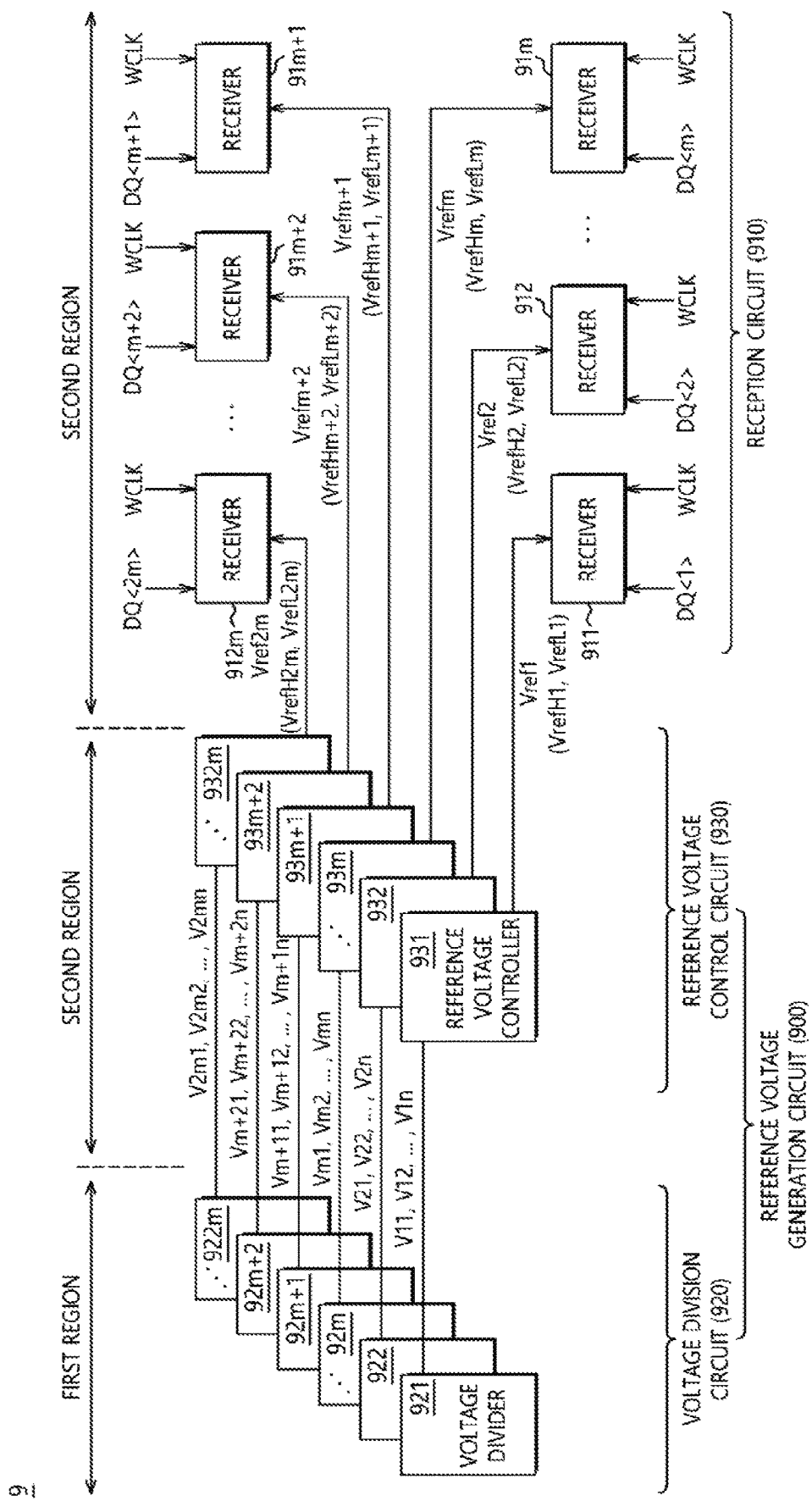
FIG. 9 is a diagram illustrating a configuration of a semiconductor apparatus in accordance with an embodiment.

FIG. 9 is a diagram illustrating a configuration of a semiconductor apparatus 9 in accordance with an embodiment of the present disclosure. Referring to FIG. 9, the semiconductor apparatus 9 may include a reference voltage generation circuit 900 and a reception circuit 910. The reference voltage generation circuit 900 may include a voltage division circuit 920 and a reference voltage control circuit 930. The voltage division circuit 920 may be located in a first region. The reference voltage control circuit 930 may be located in a second region. The reception circuit 910 may be located in a third region. The voltage division circuit 920 may include a plurality of voltage dividers 921, 922, . . . , 92m, 92m+1, 92m+2, . . . , 922m. The reference voltage control circuit 930 may include a plurality of reference voltage controllers 931, 932, . . . , 93m, 93m+1, 93m+2, . . . , 932m. The plurality of voltage dividers 921, 922, . . . , 92m, 92m+1, 92m+2, . . . , 922m may correspond to the plurality of reference voltage controllers 931, 932, . . . , 93m, 93m+1, 93m+2, . . . , 932m in a one-to-one manner. When compared with the semiconductor apparatus 1, the semiconductor apparatus 9 may include the plurality of voltage dividers 921, 922, . . . , 92m, 92m+1, 92m+2, . . . , 922m coupled to the plurality of reference voltage controllers 931, 932, . . . , 93m, 93m+1, 93m+2, . . . , 932m, respectively and independently. The voltage divider 921 may generate the plurality of division voltages V11, V12, . . . , y1n. The reference voltage controller 931 may receive the plurality of division voltages V11, V12, . . . , y1n. The reference voltage controller 931 may generate the reference voltage Vref1 or the first reference voltage VrefH1 and the second reference voltage VrefL1 by selecting at least one division voltage among the plurality of division voltages V11, V12, . . . , V1n. The receiver 911 may receive the reference voltage Vref1 or the first reference voltage VrefH1 and the second reference voltage VrefL1 from the reference voltage controller 931. In synchronization with the clock signal WCLK, the receiver 911 may determine the data DQ<1> by comparing the reference voltage Vref1 with the data DQ<1> or by comparing the first reference voltage VrefH1 and the second reference voltage VrefL1 with the data DQ<1>. The voltage divider 922 may generate the plurality of division voltages V21, V22, . . . , V2n. The reference voltage controller 932 may receive the plurality of division voltages V21, V22, . . . , V2n. The reference voltage controller 932 may generate the reference voltage Vref2 or the first reference voltage VrefH2 and the second reference voltage VrefL2 by selecting at least one division voltage among the plurality of division voltages V21, V22, . . . , V2n. The receiver 912 may receive the reference voltage Vref2 or the first reference voltage VrefH2 and the second reference voltage VrefL2 from the reference voltage controller 932. In synchronization with the clock signal WCLK, the receiver 912 may determine the data DQ<2> by comparing the reference voltage Vref2 with the data DQ<2> or by comparing the first reference voltage VrefH2 and the second reference voltage VrefL2 with the data DQ<2>. The voltage divider 92m may generate the plurality of division voltages Vm1, Vm2, . . . , Vmn. The reference voltage controller 93m may receive the plurality of division voltages Vm1, Vm2, . . . , Vmn. The reference voltage controller 93m may generate the reference voltage Vrefm or the first reference voltage VrefHm and the second reference voltage VrefLm by selecting at least one division voltage among the plurality of division voltages Vm1, Vm2, . . . , Vmn. The receiver 91m may receive the reference voltage Vrefm or the first reference voltage VrefHm and the second reference voltage VrefLm from the reference voltage controller 93m. In synchronization with the clock signal WCLK, the receiver 91m may determine the data DQ<m> by comparing the reference voltage Vrefm with the data DQ<m> or by comparing the first reference voltage VrefHm and the second reference voltage VrefLm with the data DQ<m>.

The voltage divider 92m+1 may generate the plurality of division voltages Vm+11, Vm+12, . . . , Vm+1n. The reference voltage controller 93m+1 may receive the plurality of division voltages Vm+11, Vm+12, . . . , Vm+1n. The reference voltage controller 93m+1 may generate the reference voltage Vrefm+1 or the first reference voltage VrefHm+1 and the second reference voltage VrefLm+1 by selecting at least one division voltage among the plurality of division voltages Vm+11, Vm+12, . . . , Vm+1n. The receiver 91m+1 may receive the reference voltage Vrefm+1 or the first reference voltage VrefHm+1 and the second reference voltage VrefLm+1 from the reference voltage controller 93m+1. In synchronization with the clock signal WCLK, the receiver 91m+1 may determine the data DQ<m+1> by comparing the reference voltage Vrefm+1 with the data DQ<m+1> or by comparing the first reference voltage VrefHm+1 and the second reference voltage VrefLm+1 with the data DQ<m+1>. The voltage divider 92m+2 may generate the plurality of division voltages Vm+21, Vm+22, Vm+2n. The reference voltage controller 93m+2 may receive the plurality of division voltages Vm+21, Vm+22, . . . , Vm+2n. The reference voltage controller 93m+2 may generate the reference voltage Vrefm+2 or the first reference voltage VrefHm+2 and the second reference voltage VrefLm+2 by selecting at least one division voltage among the plurality of division voltages Vm+21, Vm+22, . . . , Vm+2n. The receiver 91m+2 may receive the reference voltage Vrefm+2 or the first reference voltage VrefHm+2 and the second reference voltage VrefLm+2 from the reference voltage controller 93m+2. In synchronization with the clock signal WCLK, the receiver 91m+2 may determine the data DQ<m+2> by comparing the reference voltage Vrefm+2 with the data DQ<m+2> or by comparing the first reference voltage VrefHm+2 and the second reference voltage VrefLm+2 with the data DQ<m+2>. The voltage divider 922m may generate the plurality of division voltages V2m1, V2m2, . . . , V2mn. The reference voltage controller 932m may receive the plurality of division voltages V2m1, V2m2, . . . , V2mn. The reference voltage controller 932m may generate the reference voltage Vref2m or the first reference voltage VrefH2m and the second reference voltage VrefL2m by selecting at least one division voltage among the plurality of division voltages V2m1, V2m2, . . . , V2mn. The receiver 912m may receive the reference voltage Vref2m or the first reference voltage VrefH2m and the second reference voltage VrefL2m from the reference voltage controller 932m. In synchronization with the clock signal WCLK, the receiver 912m may determine the data DQ<2m> by comparing the reference voltage Vref2m with the data DQ<2m> or by comparing the first reference voltage VrefH2m and the second reference voltage VrefL2m with the data DQ<2m>.

While certain embodiments have been described above, it will be understood to those skilled in the art that the described embodiments represent only a limited number of possible embodiments. Accordingly, the semiconductor apparatus for generating reference voltage should not be limited based on the described embodiments. Rather, the semiconductor apparatus for generating reference voltage described herein should only be limited in light of the claims that follow when taken in conjunction with the above description and accompanying drawings.

What is claimed is:

1. A semiconductor apparatus comprising:
a voltage divider configured to divide a power supply voltage into a plurality of division voltages;
a reference voltage control circuit including a plurality of reference voltage controllers, each of the plurality of reference voltage controllers configured to receive in common the plurality of division voltages; and
a reception circuit including a plurality of receivers, each of the plurality of receivers configured to receive data by utilizing two reference voltages,
wherein the plurality of reference voltage controllers are coupled to the plurality of receivers in a one-to-one manner, and each of the plurality of reference voltage controllers is configured to select two division voltages among the plurality of division voltages, and provide the two division voltages as the two reference voltages to a corresponding receiver among the plurality of receivers.

2. The semiconductor apparatus of claim 1, wherein the voltage divider is configured to output the plurality of division voltages from a plurality of nodes between a plurality of division resistors, which are coupled to each other in series between the power supply voltage and a ground voltage.

3. The semiconductor apparatus of claim 1, wherein at least one reference voltage controller among the plurality of reference voltage controllers is configured to provide a first reference voltage and a second reference voltage having a lower voltage level than the first reference voltage.

4. The semiconductor apparatus of claim 3, wherein the at least one reference voltage controller among the plurality of reference voltage controllers comprises:
a voltage signal generator configured to output an intermediate voltage code and a voltage difference code based on a reference voltage code, a combiner code, a pin determination signal, and a setting signal;
a first selection code generator configured to output a first selection code based on the intermediate voltage code and the voltage difference code;
a second selection code generator configured to output a second selection code based on the intermediate voltage code and the voltage difference code;
a first multiplexer (MUX) configured to output the first reference voltage by selecting one division voltage among the plurality of division voltages based on the first selection code; and
a second MUX configured to output the second reference voltage by selecting another one division voltage among the plurality of division voltages based on the second selection code.

5. The semiconductor apparatus of claim 4, wherein the voltage signal generator comprises:
a pin selection circuit configured to output a pin selection signal based on the pin determination signal and the setting signal;
a first flip-flop configured to output the reference voltage code as the intermediate voltage code based on the pin selection signal; and
a second flip-flop configured to output the combiner code as the voltage difference code based on the pin selection signal.

6. The semiconductor apparatus of claim 4, wherein the first selection code generator comprises:
an adder configured to add the voltage difference code to the intermediate voltage code to generate a first reference voltage code; and
a first decoder configured to decode the first reference voltage code to output the first selection code.

7. The semiconductor apparatus of claim 4, wherein the second selection code generator comprises:
a subtractor configured to subtract the voltage difference code from the intermediate voltage code to output a second reference voltage code; and
a second decoder configured to decode the second reference voltage code to output the second selection code.

8. The semiconductor apparatus of claim 3, wherein at least one receiver among the plurality of receivers comprises:
a first comparator configured to compare the first reference voltage and the data to output a first data determination signal;
a second comparator configured to compare the second reference voltage and the data to output a second data determination signal; and
a data combiner configured to generate, in synchronization with a clock signal, output data based on the first data determination signal and the second data determination signal.

9. The semiconductor apparatus of claim 1, wherein the voltage divider is located in a first region, the reference voltage control circuit is located in a second region, and the reception circuit is located in a third region,
wherein the second region is between the first region and the third region.

10. A semiconductor apparatus comprising:
a first receiver configured to receive first data by utilizing a first reference voltage and a second reference voltage;
a second receiver configured to receive second data by utilizing a third reference voltage and a fourth reference voltage;
a voltage divider configured to divide a power supply voltage into a plurality of division voltages;
a first reference voltage controller configured to select two division voltages among the plurality of division voltages and provide the selected voltages, as the first reference voltage and the second reference voltage, to the first receiver; and
a second reference voltage controller configured to select two division voltages among the plurality of division voltages and provide the selected voltages, as the third reference voltage and the fourth reference voltage, to the second receiver.

11. A semiconductor apparatus comprises:
a voltage division circuit including a plurality of voltage dividers located in a first region, each of the plurality of voltage dividers configured to divide a power supply voltage into a plurality of division voltages; and
a reference voltage control circuit including a plurality of reference voltage controllers located in a second region, each of the plurality of reference voltage controllers coupled to the plurality of voltage dividers in a one-to-one manner; and a reception circuit including a plurality of receivers located in a third region, each of the plurality of receivers configured to receive data by utilizing two reference voltages, wherein the plurality of reference voltage controllers are coupled to the plurality of receivers in a one-to-one manner, and each of the plurality of reference voltage controllers is configured to select two division voltages among the plurality of division voltages, which are received from a corresponding voltage divider among the plurality of voltage dividers, and provide the two division voltages as two reference voltages to a corresponding receiver among the plurality of receivers.

12. The semiconductor apparatus of claim 11, wherein at least one voltage divider among the plurality of voltage dividers is configured to output the plurality of division voltages from a plurality of nodes between a plurality of division resistors, which are coupled to each other in series between the power supply voltage and a ground voltage.

13. The semiconductor apparatus of claim 11, wherein at least one reference voltage controller among the plurality of reference voltage controllers is configured to provide a first reference voltage and a second reference voltage having a lower voltage level than the first reference voltage.

14. The semiconductor apparatus of claim 13, wherein the at least one reference voltage controller among the plurality of reference voltage controllers comprises:

a voltage signal generator configured to output an intermediate voltage code and a voltage difference code based on a reference voltage code, a combiner code, a pin determination signal, and a setting signal;

a first selection code generator configured to output a first selection code based on the intermediate voltage code and the voltage difference code;

a second selection code generator configured to output a second selection code based on the intermediate voltage code and the voltage difference code;

a first multiplexer (MUX) configured to output the first reference voltage by selecting one division voltage among the plurality of division voltages based on the first selection code; and a second MUX configured to output the second reference voltage by selecting another one division voltage among the plurality of division voltages based on the second selection code.

15. The semiconductor apparatus of claim 13, wherein at least one receiver among the plurality of receivers comprises:

a first comparator configured to compare the first reference voltage and the data to output a first data determination signal;

a second comparator configured to compare the second reference voltage and the data to output a second data determination signal; and a data combiner configured to generate output data based on the first data determination signal and the second data determination signal.

* * * * *